United States Patent
Mizushima et al.

(10) Patent No.: US 7,609,052 B2
(45) Date of Patent: Oct. 27, 2009

(54) CONTACT PUSHER, CONTACT ARM, AND ELECTRONIC DEVICE HANDLING APPARATUS

(75) Inventors: Ayumu Mizushima, Tokyo (JP); Jun Ogura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/610,043

(22) Filed: Dec. 13, 2006

(65) Prior Publication Data
US 2007/0200555 A1    Aug. 30, 2007

(30) Foreign Application Priority Data
Feb. 13, 2006    (WO) ................ PCT/JP2006/302461

(51) Int. Cl.
*G01R 31/28* (2006.01)
(52) U.S. Cl. .................................. 324/158.1
(58) Field of Classification Search .............. 324/158.1
See application file for complete search history.

(56) References Cited

U.S. PATENT DOCUMENTS

| | | | | |
|---|---|---|---|---|
| 522,717 | A | * | 7/1894 | Tsurishima et al. ........... 72/215 |
| 5,708,222 | A | | 1/1998 | Yonezawa et al. |
| 6,359,457 | B1 | * | 3/2002 | Kund ........................ 324/760 |
| 6,556,032 | B2 | * | 4/2003 | Uher et al. .................. 324/755 |
| 2005/0012498 | A1 | * | 1/2005 | Lee et al. ................. 324/158.1 |
| 2005/0275398 | A1 | | 12/2005 | Yamashita |

FOREIGN PATENT DOCUMENTS

| | | |
|---|---|---|
| JP | 8-43487 | 2/1996 |
| JP | 9-243704 | 9/1997 |
| JP | 11-344527 | 12/1999 |
| JP | 2000-193716 | 7/2000 |
| WO | 2004/051292 | 6/2004 |

OTHER PUBLICATIONS

English language Abstract of JP 8-43487.
English language Abstract of JP 11-344527.
English language Abstract of JP 9-243704.
English language Abstract of JP 2000-193716.
U.S. Appl. No. 11/571,428 to Ito et al., which was filed Dec. 29, 2006.
U.S. Appl. No. 11/444,425 to Mineo et al., which was filed Jun. 1, 2006.
U.S. Appl. No. 10/599,374 to Kiyokawa et al., which was filed Sep. 27, 2006.
U.S. Appl. No. 11/570,682 to Yamashita et al., which was filed Dec. 15, 2006.

* cited by examiner

*Primary Examiner*—Ha Tran T Nguyen
*Assistant Examiner*—Shaun Campbell
(74) *Attorney, Agent, or Firm*—Greenblum & Bernstein, P.L.C.

(57) ABSTRACT

A contact pusher attached to the front end of a contact arm bringing an IC device into contact with a contact part of a test head and pushing the IC device is provided with a suction pad for picking up and holding an IC device, a first press part for pushing against a package of an IC device, a second press part for pushing against terminals of the IC device, and a base part for conducting heat to the first press part, the first press part and the base part contacting each other and the first press part provided to be able to finely move relative to the base part.

8 Claims, 15 Drawing Sheets

CONTACT PUSHER, CONTACT ARM, AND ELECTRONIC DEVICE HANDLING APPARATUS

TECHNICAL FIELD

The present invention relates to a contact pusher attached to the front end of a contact arm bringing a semiconductor integrated circuit or other type of electronic device (below, also referred to representatively as an "IC device") into contact with a contact part of a test head and pushing against the IC device and to a contact arm and electronic device test apparatus provided with the same.

BACKGROUND ART

In the process of production of an IC device or other electronic device, an electronic device test apparatus is used to test the performance and functions of the IC device in the packaged state.

In a handler forming part of the electronic device test apparatus, a large number of IC devices carried a tray are placed in the handler. While applying high temperature thermal stress, the input/output terminals of each IC device are brought into electrical contact with the contact part of the test head for testing at the electronic device test apparatus main body (below, also called a "tester"). Further, when the test ends, each IC device is ejected from the test head and reloaded on another tray for sorting into either the category of good devices and defective devices.

In an electronic device test apparatus for logic IC devices, two, four, eight, or another relatively small number of IC devices are picked up, held and simultaneously moved by the contact arms and the IC devices are simultaneously pushed against the contact parts of the test head to test the IC devices.

The front end of a contact arm for testing a QFP (Quad Flat Package) has a contact pusher 220' such as shown in FIG. 13 detachably attached to it, This contact pusher 220' is comprised of a first press part 250 for pushing against the top surface of the package 11 of the IC device 10, a second press part 260 for pushing against the terminals 12 of the IC device 10, and a base part 230 to which the first and second press parts 250 and 260 are bolted.

In this type of contact pusher 220', the heat supplied from a heater (not shown) provided at the body of the contact arm 200' or a cooling/heating source is conducted through the base part 230 and first press part 250 to the IC device 10 so as to apply thermal stress to the IC device 10 during the test (arrow in FIG. 13).

However, when there are variations in the thickness of the package 11 or height of the terminals 12 in the IC device 10 under test, the IC device 10 is liable not to be suitably given the desired thermal stress or the terminals 12 are liable to be warped along with excessive pushing.

That is, variations in production etc. may result in a package 11 becoming relatively thin or front ends of the terminals 12 becoming relatively high, so in an IC device 10a with a low height from the front ends of the terminals 12 to the top surface of the package 11, as shown in FIG. 14A, the second press part 260 will contact the terminals 12, but the first press part 250 will not contact the top surface of the package 11. Therefore, the heat conducted to the IC device 10a will become unstable. As a result, there is the problem that the temperature will be insufficiently applied and a stable test quality will no longer be obtained in the device test. Further, there is the problem that the terminals 12 will be excessively pushed resulting in the terminals 12 being bent. It is required that deformation of the terminals 12 of the IC device 10 under test be avoided as much as possible.

On the other hand, variations in production etc. may result in a package 11 becoming relatively thick or the front ends of the terminals 12 becoming relatively low or dust etc. may adhere to the package 11, so in an IC device 10b with a high height from the front ends of the terminals 12 to the top surface of the package 11, as shown in FIG. 14B, the first press part 250 will contact the top surface of the package 11, but the second press part 260 will not contact the terminals 12. Therefore, there is the problem that the terminals 12 will be bent by being excessively pressed by the contact pins 320 of the contact part 310.

DISCLOSURE OF THE INVENTION

An object of the present invention is to provide a contact pusher able to stably conduct heat and suitably apply thermal stress without being affected by variations in the shape of the electronic device under test and to provide a contact arm and electronic device test apparatus provided with the same.

To achieve the above object, according to the present invention, there is provided a contact pusher to be attached to a front end of a contact arm for bringing an electronic device under test into contact with a contact part of a test head and pushing against the electronic device under test, provided with a holding means for holding the electronic device under test, a first pushing means for pushing against a body of the electronic device under test, and a heat conducting means for conducting heat to the first pushing means, the first pushing means and the heat conducting means contacting each other to be able to conduct heat, and the first pushing means being provided so as to be able to move finely along a direction for pushing against the electronic device under test.

In the present invention, the first pushing means can be brought into contact with the heat conducting means and moved finely along the pushing direction. By finely moving the first pushing means, it becomes possible to absorb variations in dimensions of the electronic device under test in the height direction. Further, by bringing the first pushing means into contact with the heat conducting means, it is possible to suitably apply thermal stress to the electronic device under test.

In the above invention, while not particularly limited to this, preferably the first pushing means is divided into a plurality of pushing portions, and the contact pusher is further provided with first biasing means for biasing the pushers along a direction where the pushing portions and the heat conducting means come into contact to enable heat conduction.

In the above invention, while not particularly limited to this, preferably the first biasing means are elastic means pushing the pushing portions in directions where the pushing portions and the heat conducting means come into contact to enable heat conduction or attracting means for attracting the pushing portions in directions where the pushing portions and the heat conducting means come into contact to enable heat conduction.

In the above invention, while not particularly limited to this, preferably the contact pusher is further provided with a second pushing means for pushing against the input/output terminals of the electronic device under test.

In the above invention, while not particularly limited to this, preferably the contact pusher is detachably attached to a front end of the contact arm.

As a specific configuration, preferably the first pushing means has a recessed shape, the heat conducting means has a projecting shape corresponding to the recessed shape of the first pushing means, and the recessed inner circumferential surface of the recessed shape of the pushing portions and the projecting outer circumferential surface of the projecting shape of the heat conducting means contact each other to enable heat conduction.

In the above invention, while not particularly limited to this, preferably the contact pusher is further provided with second biasing means for biasing the pushing portions along a direction substantially perpendicular to a main surface of the electronic device under test.

In the above invention, while not particularly limited to this, preferably the recessed inner circumferential surface of the first pushing means is inclined and the projecting outer circumferential surface of the heat conducting means is inclined corresponding to the recessed inner circumferential surface.

Further, as another specific configuration, preferably the first pushing means has a projecting shape, the heat conducting means has a recessed shape corresponding to the projecting shape of the first pushing means, and the projecting outer circumferential surfaces of the projecting shapes of the pushing portions and the recessed inner circumferential surface of the recessed shape of the heat conducting means contact each other to enable heat conduction.

In the above invention, while not particularly limited to this, preferably the contact pusher is further provided with second biasing means for biasing the pushing portions in a direction substantially perpendicular to a main surface of the electronic device under test.

In the above invention, while not particularly limited to this, preferably the projecting outer circumferential surface of the first pushing means is inclined and the recessed inner circumferential surface of the heat conducting means is inclined so as to correspond to the projecting outer circumferential surface.

Further, to achieve the above object, according to the present invention, there is provided a contact pusher to be attached to a front end of a contact arm bringing an electronic device under test into contact with a contact part of a test head and pushing against the electronic device under test, provided with a holding means for picking up by suction and holding the electronic device under test, a first pushing means for contacting a package body of the electronic device under test held by the holding means and conducting heat supplied from a cooling/heating source in the contact arm to the electronic device under test or radiating self-heating accompanying power consumption of the electronic device under test, a heat conducting means conducting heat between the contact arm and the first pushing means, and a second pushing means comprised of an electrical insulating member for abutting against and pushing input/output terminals of the electronic device under test, the first pushing means and the heat conducting means able to move finely relative to each other along a direction pushing against the electronic device under test and contacting each other to enable heat conduction, and the contact pusher contacting the contact arm to be able to conduct heat and able to be detached from the contact arm in accordance with the type of the electronic device under test.

Further, to achieve the above object, according to the present invention, there is provided a contact arm for making an electronic device under test contact a contact part of a test head, provided with any of the above contact pushers and a heating means for heating the electronic device under test through the heat conducting means and the first pushing means of the contact pusher, the contact pusher being attached to the front end of the contact arm.

Further, to achieve the above object, according to the present invention, there is provided an electronic device test apparatus used for bringing input/output terminals of an electronic device under test into electrical contact with a contact part of a test head and testing the electrical characteristics of the electronic device under test, the electronic device test apparatus provided with the above contact arm.

[DESCRIPTION OF THE NOTATIONS]

200... electronic device test apparatus
  205... XY movement system
    210, 210'... contact arm
      212... heater
      220a to 220f, 220'... contact pusher
        230... base part
        232... bottom projecting part
          232a... outer circumferential surface
        237... second spring
        240... suction pad
        250... first press part
        251... pushing portion
        252... center recessed part
          252a... inner circumferential surface
        257... first spring
        260... second press part

BEST MODE FOR WORKING THE INVENTION

Below, embodiments of the present invention will be explained with reference to the drawings.

First Embodiment

Figure 1:
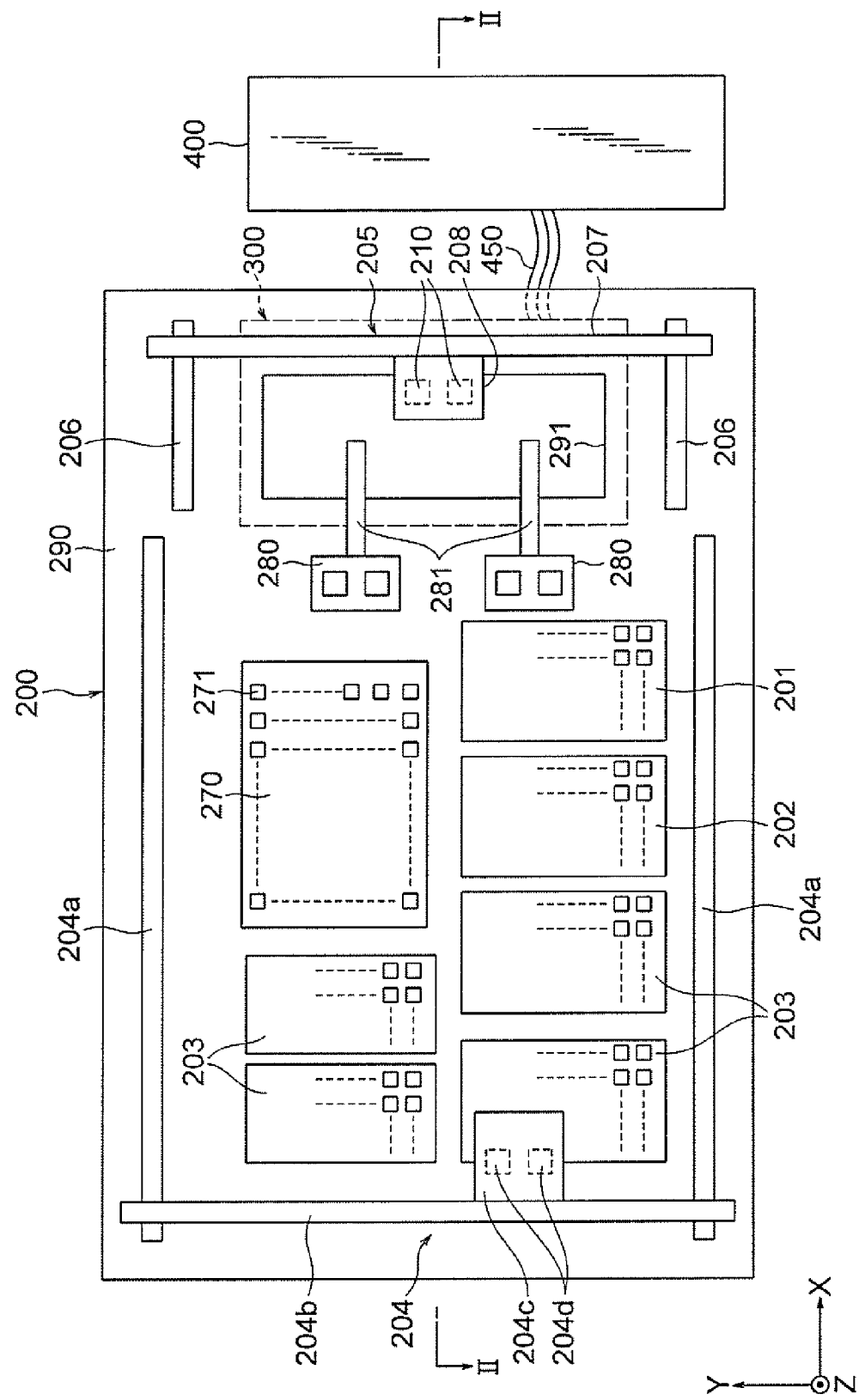
FIG. 1 is a plan view of an electronic device test apparatus according to a first embodiment of the present invention.

An electronic device test apparatus 200 according to a first embodiment of the present invention is a logic IC test apparatus for testing logic ICs. As shown in FIG. 1, it is provided with various types of trays 201 to 203, XY movement systems 204, 205, a heat plate 270, and buffer parts 280 and IC devices 10 are tested by using a test head 300 and a tester 400. The test head 300 and the tester 400 are connected through a cable 450.

This electronic device test apparatus 200 pushes IC devices 10 before test carried in on a feed tray 202 by the XY movement systems 204, 205 against contact parts 310 of the test head 300, has the tester 400 test the IC devices 10 through this test head 300 and cable 450, then stores the IC devices 10 finished being tested on classification trays 203 in accordance with the test results.

Figure 2:
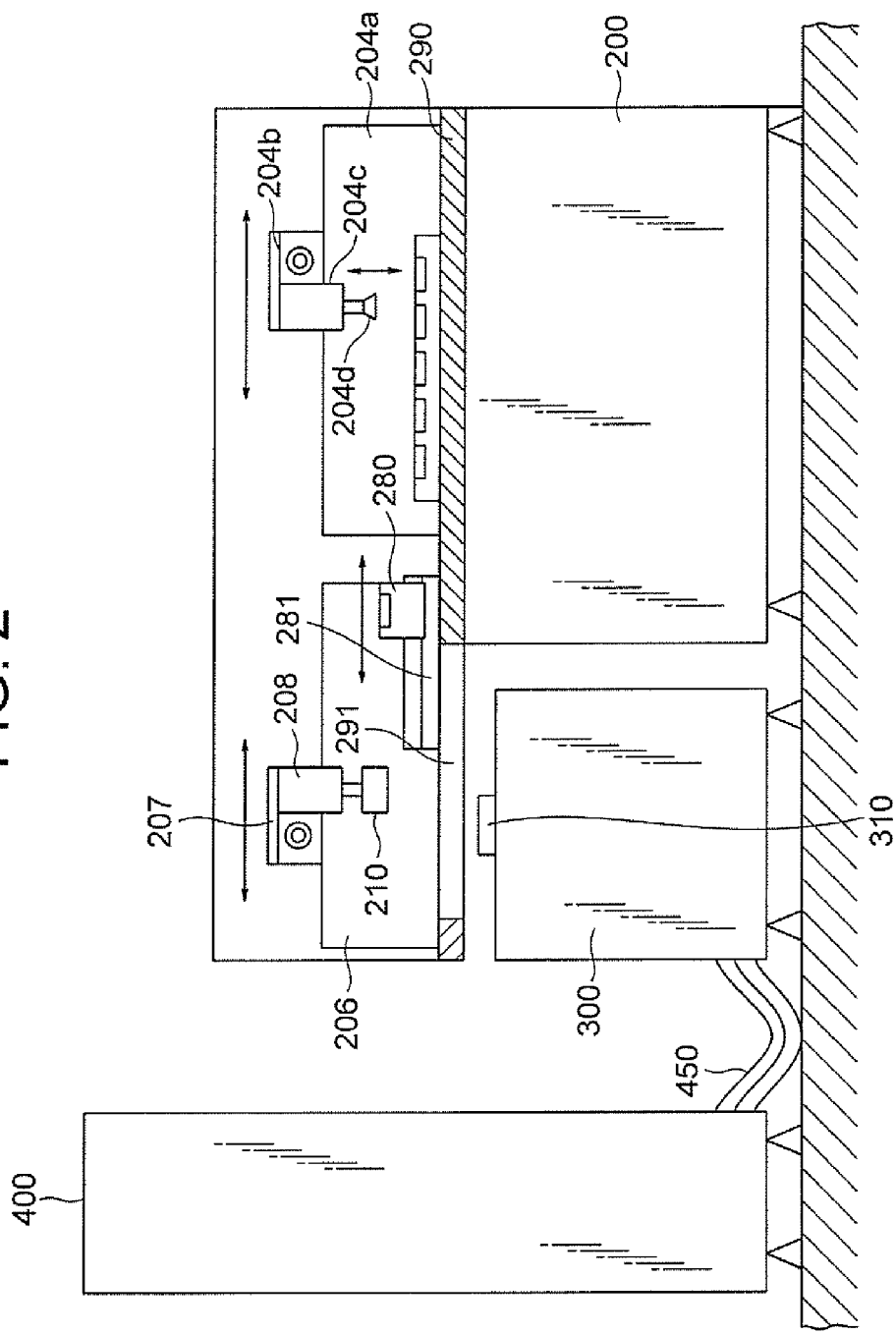
FIG. 2 is a cross-sectional view along the line II-II of FIG. 1.

The apparatus board 290 of this electronic device test apparatus 200 is provided on it with XY movement systems 204, 205. Further, the apparatus board 290 is formed with an opening 291. As shown in FIG. 2, the contact parts 310 of the test head 300 arranged at the back side of the handler 200 are pushed against by IC devices 10 through the opening 291.

The XY movement system 204 provided on the apparatus board 290 is comprised of the rails 204a, 204b provided along the X-axial direction and Y-axial direction, a mounting base 204c able to move along these rails 204a, 204b, and suction devices 204d attached to this mounting base 204c. The suction devices 204d are designed to be able to move over the trays 201 to 203 and heat plate 270 and two buffer parts 280. Further, the pads of the suction devices 204d are designed to be able to move in the Z-axial direction (that is, vertical direction) by a not shown Z-axial direction actuator. The two suction devices 204d provided on the mounting base 204c can pick up, transport, and release two IC devices at one time. Note that in the present invention, the number of IC devices 10 which the XY conveyor system 204 simultaneously moves is not limited to two and for example may also be made four, eight, or 16.

As opposed to this, the other XY movement system 205 is comprised of rails 206, 207 provided along the X-axial direction and Y-axial direction, a mounting base 208 able to move along these rails 206, 207, and two contact arms 210 attached to this mounting base 208. The contact arms 210 are designed to be able to move between the buffer parts 280 and test head 300. The front ends of the contact arms 210 have suction pads 240 (FIG. 3) attached to them. The two contact arms 210 provided on the mounting base 208 can pick up, transport, push, and release two IC devices 10 at one time. Note that in the present invention, the number of IC devices which the XY conveyor system 205 simultaneously moves is not limited to two and for example may also be made four, eight, or 16.

The mounting base 208 of this XY movement system 205 includes a Z-axis actuator moving it up and down in the Z-axial direction. Due to this, the entire mounting base 208 holding the two contact arms 210 can be moved to approach and move away from the contact parts 310.

Figure 3:
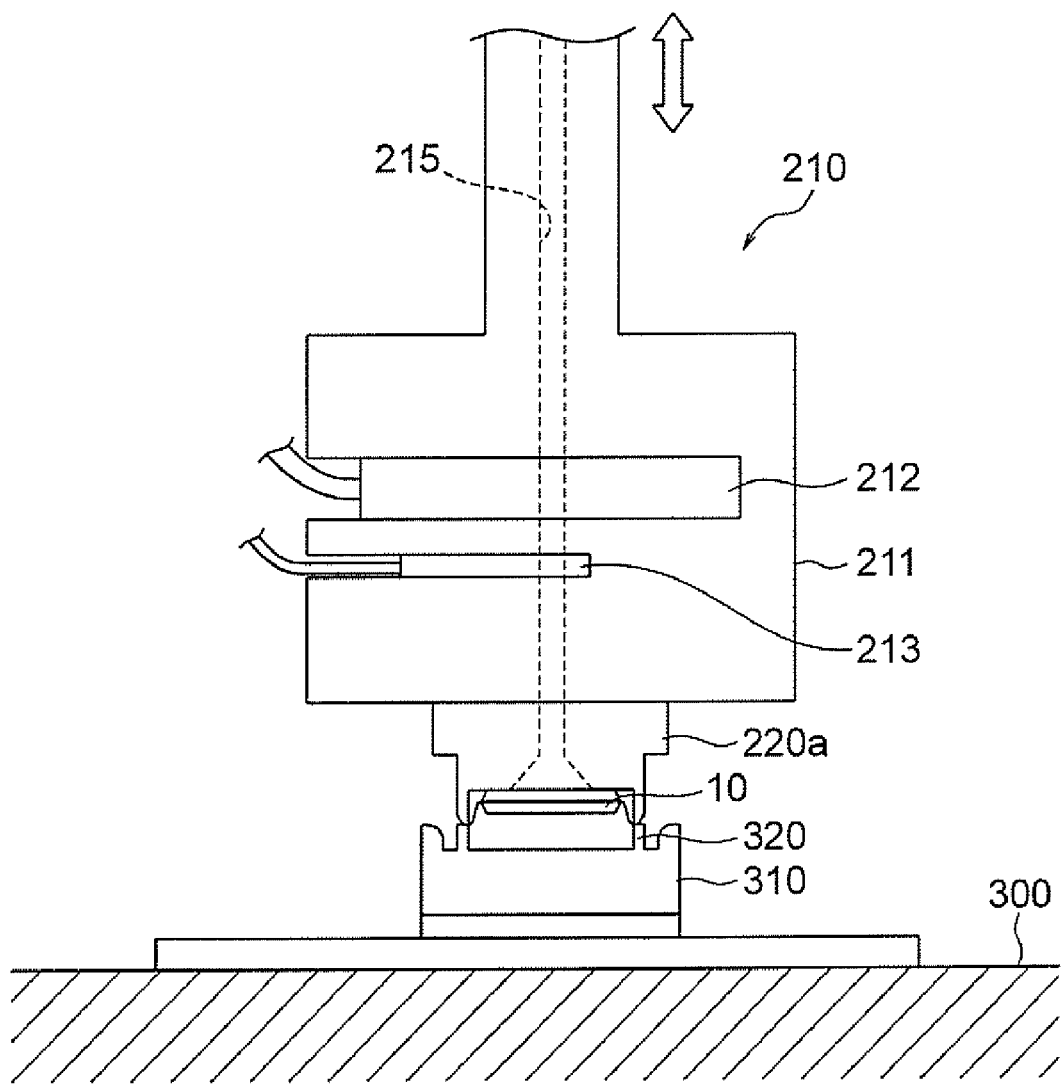
FIG. 3 is a side view showing a contact arm according to a first embodiment of the present invention.

In particular, each contact arm 210 according to the present embodiment, as shown in FIG. 3, is comprised of an arm body 211 coupled with the mounting base 208 and a contact pusher 220a exchanged in accordance with the type of the IC device 10 under test.

Figure 4:
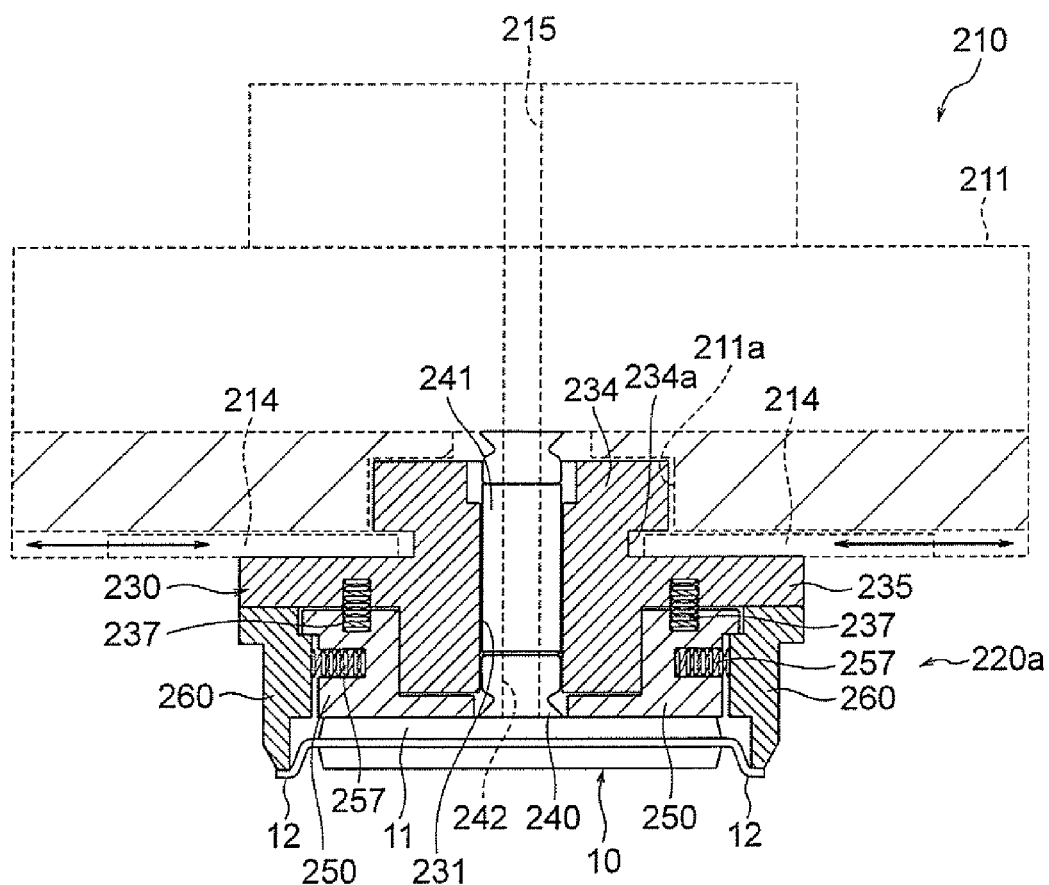
FIG. 4 is a cross-sectional view showing a contact pusher according to a first embodiment of the present invention.
Figure 5:
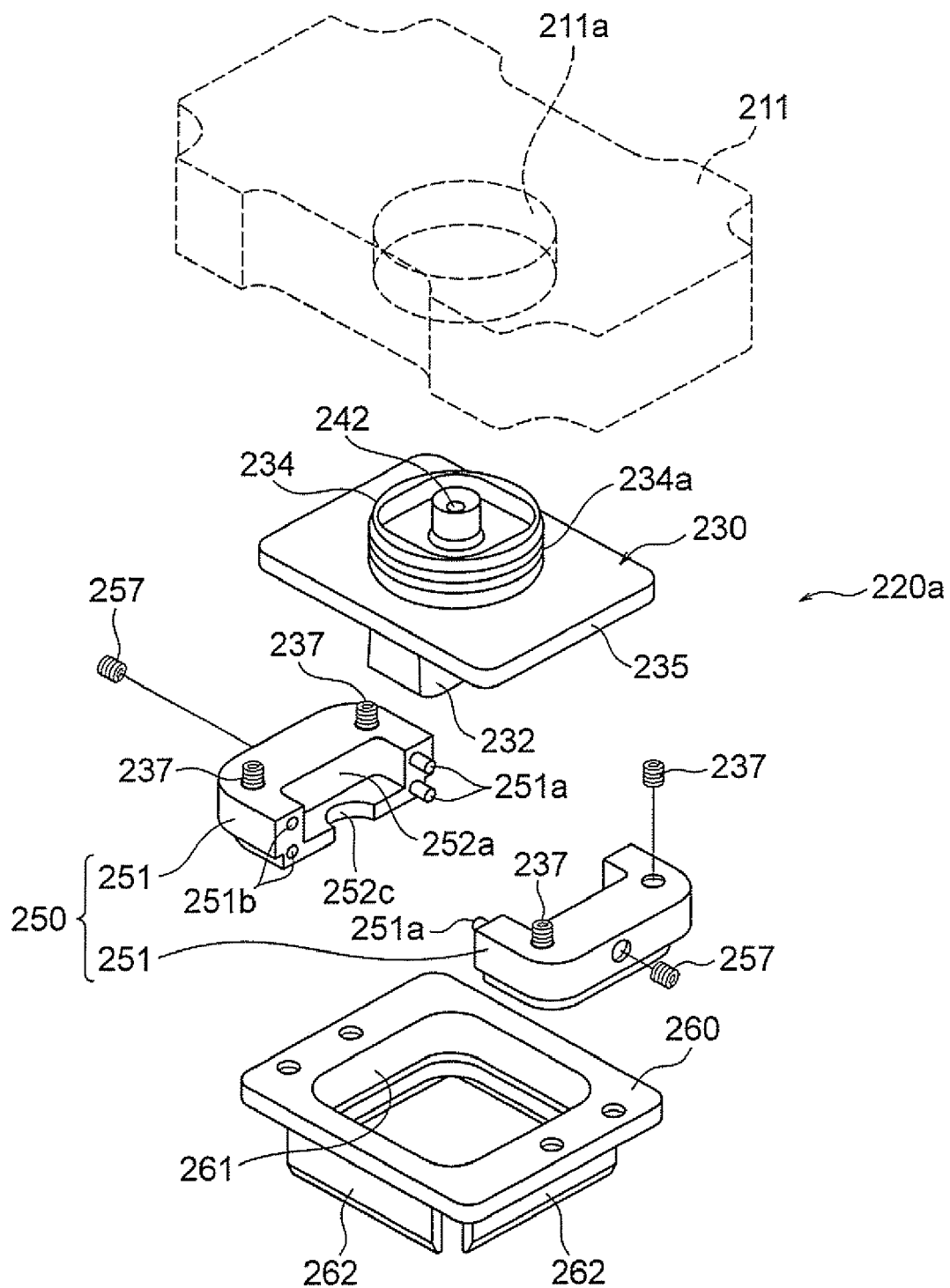
FIG. 5 is a disassembled perspective view of a contact pusher according to a first embodiment of the present invention.

As shown in FIG. 4 and FIG. 5, the arm body 211 of each contact arm 210 is formed with an attachment hole 211a for attaching a contact pusher 220a. As shown in FIG. 4, two lever members 214 are provided around the opening of this attachment hole 211a. These lever members 214 are designed to be movable along a direction substantially parallel to the bottom surface of the arm body 211.

Further, as shown in FIG. 3, each arm body 211 has a heater 212 embedded in it and is designed to enable the picked up and held IC device 10 to be maintained in temperature. Further this arm body 211 also has a temperature sensor 213 embedded in it. This temperature sensor 213 detects the temperature of the arm body 211 so as to indirectly detect the temperature of the IC device 10 and supplies this information for ON/OFF control of the heater 212. Note that in the present invention, the temperature imparting means embedded in the arm body 211 is not limited to a heater 212 or other heating device. A cooling device may also be embedded or both a heating and a cooling device may be embedded.

The contact pusher 220a of each contact arm 210, as shown in FIG. 4, is comprised of a suction pad 240 for picking up and holding an IC device 10, a first press part 250 for pressing the top surface of the package 11 of the IC device 10, a second press part 260 for pressing all of the terminals 12 of the IC device 10, and a base part 230 to which the first press part 250 is attached via second springs 237 and to which the second press part 260 is fixed by bolting etc. Note that the package 11 of the IC device 10 in the present embodiment corresponds to an example of the body of the electronic device under test in the claims.

Figure 6:
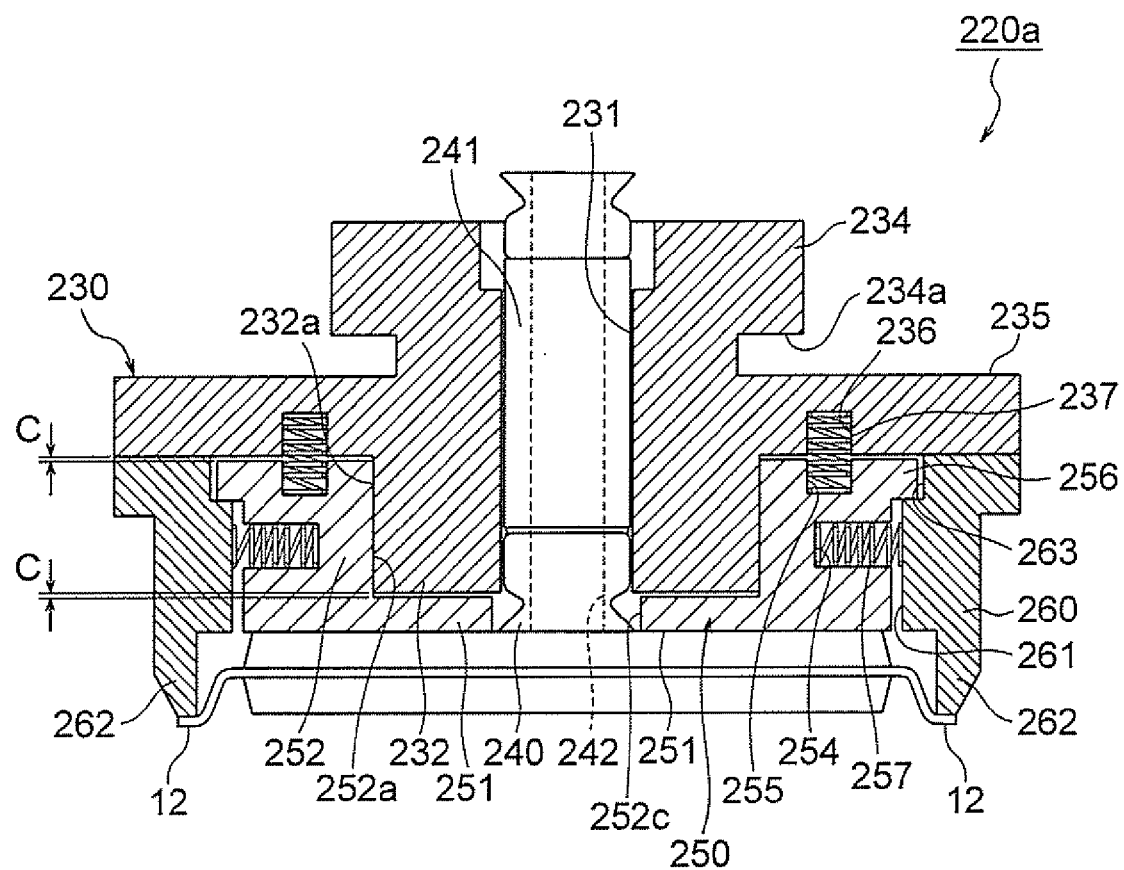
FIG. 6 is an enlarged sectional view of a contact pusher according to a first embodiment of the present invention.

The base part 230, as shown in FIG. 4 to FIG. 6, has a top projecting part 234 projecting vertically upward in a cylindrical shape at its top, a bottom projecting part 232 projecting vertically downward in an angular columnar shape at its bottom, and a plate shaped based body 235 interposed between these. This base part 230 is formed at its center with a through hole 231 for insertion of the suction pad 240 and a tube 241 running from the top surface to the bottom surface. Note that this tube 241 is preferably able to move finely in the vertical direction relative to the base part 230. Further, the base body 235 is formed at its bottom surface with insertion holes 236 for insertion of the second springs 237 at a plurality of locations.

The base end of the top projecting part 234 is formed with a circumferential groove 234a. When attaching the contact pusher 220a to the contact arm 210, the top projecting part 234 of the base part 230 is inserted into the attachment hole 211a formed at the arm body 211 and the lever members 214 of the arm body 211 are engaged with the groove 234a of the top projecting part 234, whereby the contact pusher 220a is fixed to the contact arm 210. At this time, the bottom end face of the arm body 211 and the top surface of the base part 230 are in close contact, so the arm body 211 and base part 230 are fixed together to be able to conduct heat.

The first press part 250, as shown in FIG. 5 and FIG. 6, is formed at its center with a recessed part 252 corresponding to the bottom projecting part 232 of the base part 230. The recessed part 252 is formed at its center with a through hole 252c for insertion of the suction pad 240.

Further, in the present embodiment, the first press part 250 is divided into two pushing portions 251 along the axial center direction of the contact pusher 220a across the axial center direction. As shown in FIG. 5, the facing side faces of the pushing portions 251 have shafts 251a sticking out from them and are formed with insertion holes 251b. The shafts 251a of one pushing portion 251 can slide into the insertion holes 251b of the other pushing portion 251. Therefore, when the pushing portions 251 are brought close to or moved apart from each other, they are guided by the shafts 251*a* in the insertion holes 251*b*. The pushing portions 251 are comprised of for example aluminum alloy, stainless steel, or another metal material excellent in heat conductivity.

The first press part 250 is formed at its top surface with second insertion holes 255 for insertion of the second springs 237 at positions facing the insertion holes 236 formed at the base part 230. Further, the first press part 250 is formed at its side faces with first insertion holes 254 for insertion of the first springs 257 and extending parts 256 projecting toward the outside.

The first press part 250 is attached to the base part 230 with the bottom projecting part 232 of the base part 230 inserted into the center recessed part 252 and with the second springs 237 inserted into the insertion holes 236, 255 and can move relative to the base part 230. Due to the elastic force of the first springs 237, the first press part 250 is pushed in a direction moving away from the base part 230, and a predetermined clearance (clearance C in FIG. 6) is formed between the base part 230 and the first press part 250 along the vertical direction.

Each suction pad 240 is arranged so as to face downward in the through hole 252*c* of a first press part 250. This suction pad 240 is communicated with a channel 215 (FIG. 3) formed in the contact arm 210 through a tube 241 inserted in the through hole 231 of the base part 230. Further this channel 215 is connected to a negative pressure source (not shown) and the negative pressure source generate negative pressure to suck air from the suction pad 240 and thereby enable an IC device 10 to be picked up and held. Further, by stopping the suction of air from the suction pad 240, the held IC device 10 can be released.

The second press part 260 is formed with terminals of shapes and an array corresponding to the type of the IC device 10 and supports the terminals 12 at predetermined positions. This second press part 260, as shown in FIG. 5, is formed at its center with an opening 261 for exposing the suction pad 240 and first press part 250 downward. Edges 262 projecting downward are formed at the four sides of the opening 261. As the material forming the second press part 260, for example, PPS (polyphenylene sulfide), Semitron (registered trademark), MC Nylon (registered trademark), or another material able to prevent charging by static electricity may be mentioned. Further, the second press part 260 may be treated on its surface to prevent charging.

Further, as shown in FIG. 6, the opening 261 is formed at its top circumferential edge with an inside groove 263 circumferentially. This inside groove 263 is engaged with the extending part 256 of the first press part 250, whereby the first press part 250 can be prevented from dropping down and the first press part 250 can freely move by a predetermined fine amount along the vertical direction. The amount of fine movement of the first press part 250 is for example 0.2 mm or so when the package 11 has a maximum manufacturing error of ±0.1 mm.

Note that even when the array of the terminals 12 is the same, there are sometimes types of IC devices where the height conditions of the terminals 12 and top surface of the package 11 differ, but in this case, it is sufficient to set an amount of fine movement so enable any type of IC device to be handled.

The second press part 260 is fixed by bolting etc. to the base part 230 to which the first press part 250 is attached. Further, the first springs 257 are interposed between the pushing portions 251 of the first press part 250 and the second press part 260. Therefore, the pushing portions 251 of the first press part 250 are pushed against the base part 230 side so that inner circumferential surface 252*a* of the center recessed part 252 of the first press part 250 is in constant contact with the outer circumferential surface 232*a* of the bottom projecting part 232 of the base part 230. Therefore, the base part 230 and the first press part 250 are able to conduct heat. Note that the contact locations of the base part 230 and the first press part 250 are preferably designed to enable easy sliding. If desired, the contact locations may be coated with a heat conductive lubricant.

Returning to FIG. 1 and FIG. 2, the two buffer parts 280 are able to move back and forth between the operating regions of the two XY movement systems 204, 205 by the rails 281 and not shown actuators. In FIG. 1, the top buffer part 280 performs the work of moving the IC devices 10 transported from the heat plate 270 to the test head 300, while the bottom buffer part 280 performs the work of ejecting the IC devices 10 finished being tested at the test head 300. Due to the existence of these two buffer parts 280, the two XY movement systems 204, 205 can operate simultaneously without interfering with each other.

In the operating region of the XY movement system 204, a feed tray 202 carrying the IC devices 10 to be tested, four classification trays 203 on which the IC devices 10 finished being tested are stored classified into categories according to the test results, and an empty tray 201 are arranged. Further, the heat plate 270 is provided at a position close to the buffer parts 280.

The heat plate 270 is for example comprised of a metal plate. It is formed in its front surface with a plurality of indentations 271 into which the IC devices 10 are dropped. These indentations 271 are supplied with IC devices 10 before testing from the feed tray 202 by the XY movement system 204. While not illustrated, the heat plate 270 is provided on its bottom surface with a heating element for applying a predetermined thermal stress to the IC devices 10. The IC devices 10 are heated to a predetermined temperature by the heat from the heating element conducted through the heat plate 270, then are pushed against the contact parts 310 of the test head 300 through one of the buffer parts 280.

Next, the operation will be explained.

Each IC device 10 before testing carried on the feed tray 202 of the electronic device test apparatus 200 is picked up and held by the XY movement system 204 and transported to an indentation 271 of the heat plate 270. Then, it is allowed to stand at the heat plate 270 for exactly a predetermined time, whereby the IC device 10 rises to a predetermined temperature. The XY movement system 204 transports IC device 10 from the feed tray 202 to the heat plate 270 before being raised in temperature, releases that IC device 10, then picks up another IC device 10 previously left at the heat plate 270 and given the predetermined temperature of thermal stress and transports it to a buffer part 280.

The buffer part 280 to which the IC devices 10 have been transported then moves to the right end of the rail 281, the IC devices 10 are picked up and held by the contact arms 210 of the XY movement system 205. As shown in FIG. 3, the contact arms 210 descend toward the test head 300 through the opening 291 of the system board 290 until the IC devices 10 strike the contact parts 310.

At this time, in the present embodiment, since the first press part 250 is provided to be able to finely move relative to the base part 230, even if there is variation in the thickness of the package 11 of the IC device 10 or front end positions of the terminals 12, that variation is absorbed and the first press part 250 contacts the package 11 of the IC device 10 to enable heat conduction and the second press part 260 is pushed against the terminals 12 of the IC device 10 by a suitable load. As a result, a stable state of heat conduction to the IC device 10 can be constantly maintained and as a result a stable test quality of the device test can be obtained. Further, at the time of the test, a suitable state of pushing against the contact pins 320 of the contact part 310 is maintained, so the problem of bending of the terminals 12 of the IC device 10 to be tested can be eliminated.

Figure 7:
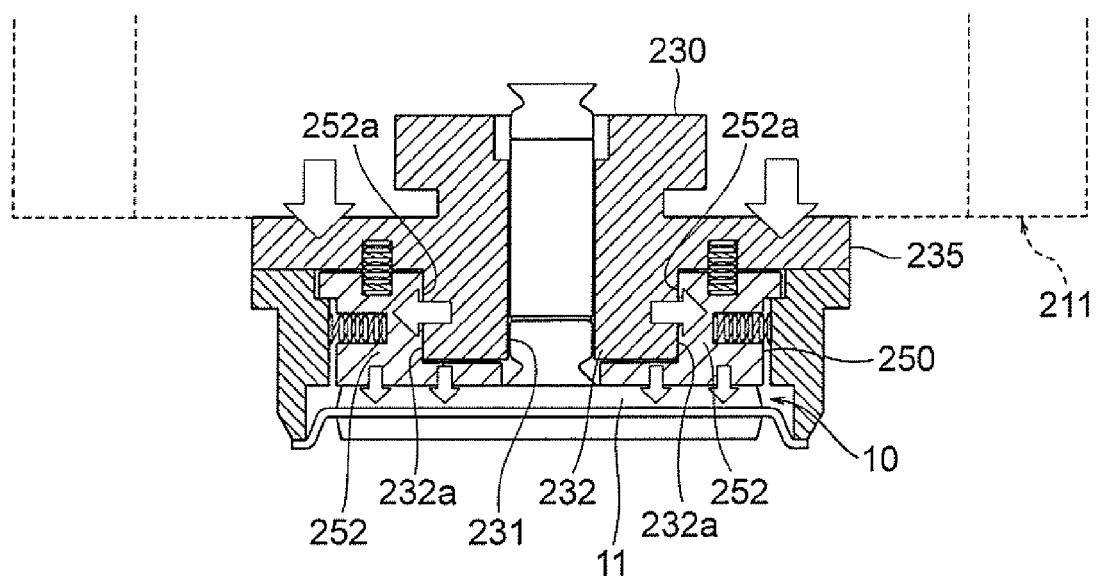
FIG. 7 is a cross-sectional view for explaining a heat conduction path in a contact pusher according to a first embodiment of the present invention.

Further, in the present embodiment, the first springs 257 are interposed between the first press part 250 and the second press part 260, and the first press part 250 is divided into the two pushing portions 251, so the inner circumferential surface 252*a* of the first press part 250 and the outer circumferential surface of the base part 230 are constantly kept in close contact. Therefore, the heat conducted at a contact arm 210 from a heater 212 through an arm body 211 to a contact pusher 220*a*, as shown in FIG. 7, travels through the route of the base body 235 of the base part 230→bottom projecting part 232 of the base part 230→outer circumferential surface 232*a* of the bottom projecting part→inner circumferential surface 252*a* of the center recessed part 252 of the first press part 250→bottom surface of the first press part 250 and realizes stable conduction of heat to the IC device 10, so it is possible to prevent variation in temperature conditions at the time of testing.

When the contact arm 210 descends and the IC device 10 contacts the contact part 310, in this state, electrical signals are input from the tester 400 through the contact pins 320 of the test head 300 (FIG. 3) to the IC device 10. Further, the response signals output from the IC device 10 are sent through the test head 300 to the tester 400. Due to this, the IC device 10 is tested for performance, functions, etc.

After the IC device 10 finishes being tested, the contact arm 210 rises, and the IC device 10 finished being tested is moved via the buffer part 280 and XY movement system 204 and stored on a classification tray 203 in accordance with the test results.

Second Embodiment

Figure 8:
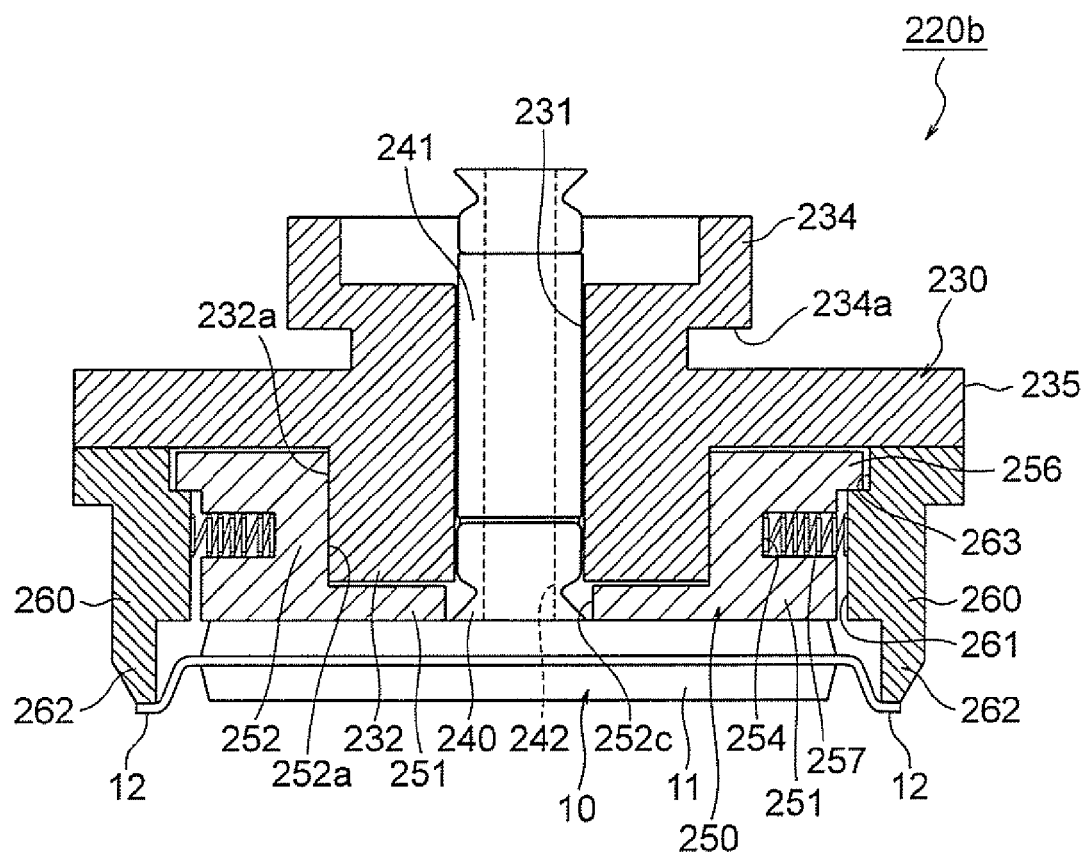
FIG. 8 is a cross-sectional view showing a contact pusher according to a second embodiment of the present invention.

The contact pusher 220*d* according to a second embodiment of the present invention, as shown in FIG. 8, differs from the contact pusher 220*a* according to the first embodiment only on the point that no second springs 237 are interposed between the base part 230 and the first press part 250. The rest of the configuration is similar to that of the contact pusher 220*a* according to the first embodiment.

As shown in the present embodiment, it is also possible not to provide the second springs 237, but to use the weight of the first press part 250 to make first press part 250 closely contact the top surface of the package 11 of the IC device 10 during pushing. Due to this, it is possible to make the base part 230 and the first press part 250 heat conductible in state and possible to finely move the first press part 250 along the vertical direction.

Third Embodiment

Figure 9:
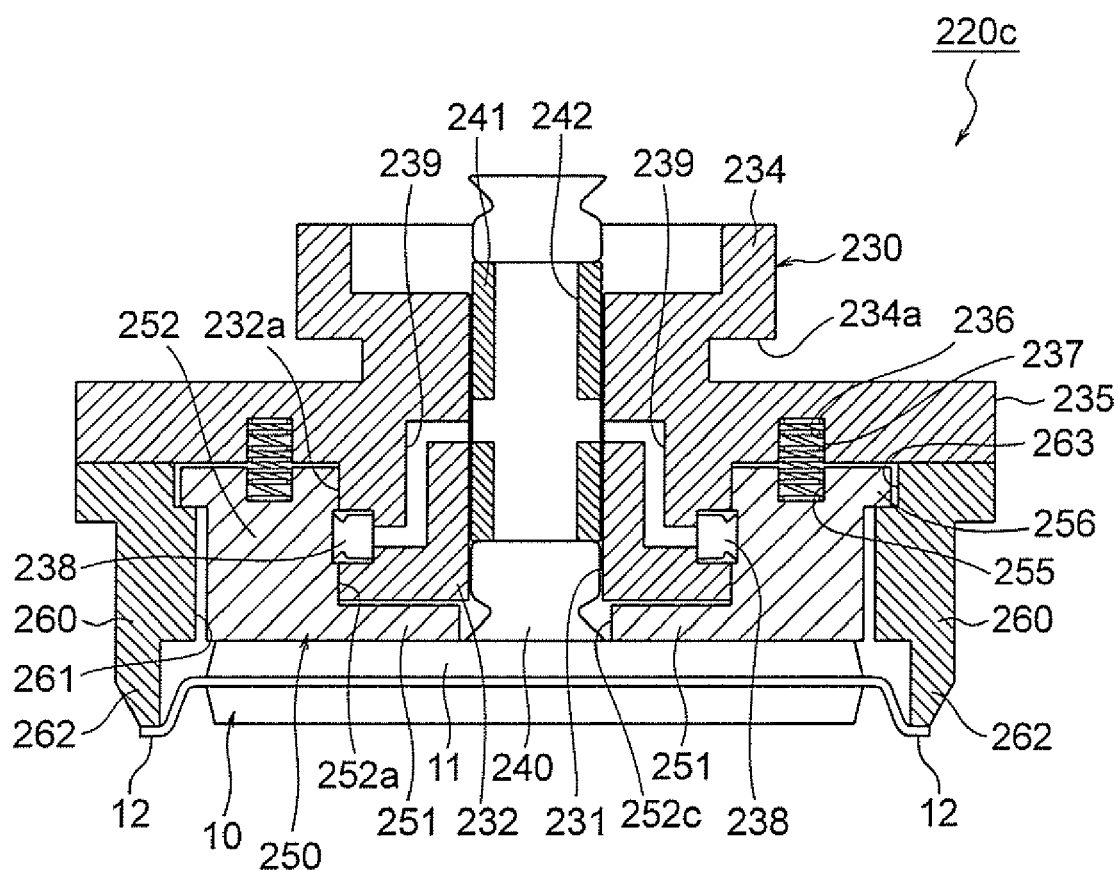
FIG. 9 is a cross-sectional view showing a contact pusher according to a third embodiment of the present invention.

The contact pusher 220*c* according to a third embodiment of the present invention, as shown in FIG. 9, differs from the contact pusher 220*a* according to the first embodiment only on the point that instead of the first springs 257 interposed between the first press part 250 and second press part 26, suction pads 238 branching off from the tube 241 and drawing the pushers 251 toward them are provided. The rest of the configuration is similar to that of the contact pusher 220*a* according to the first embodiment.

In the present embodiment, as shown in FIG. 9, the base part 230 is formed with channels 239 passing through from the through hole 231 to the outer circumferential surface 232*a* of the bottom projecting part 232. The front end of each channel 239 at the outer circumferential surface 232*a* side is provided with a suction pad 238 opening toward the outside.

Each channel 239 formed in the base part 230 is communicated with a channel 242 of the tube 241 inserted in the through hole 231. Therefore, while the suction pad 240 provided at the front end of the contact pusher 220*c* is attracting the device, the suction pads 238 open at the sides are drawing in the first press part 250, so the outer circumferential surface 232*a* of the bottom projecting part 232 of the base part 230 and the inner circumferential surface 252*a* of the center recessed part 252 of the first press part 250 closely contact each other. Due to this, the base part 230 and the first press part 250 can conduct heat and the first press part 250 can finely move along the vertical direction.

Fourth Embodiment

Figure 10:
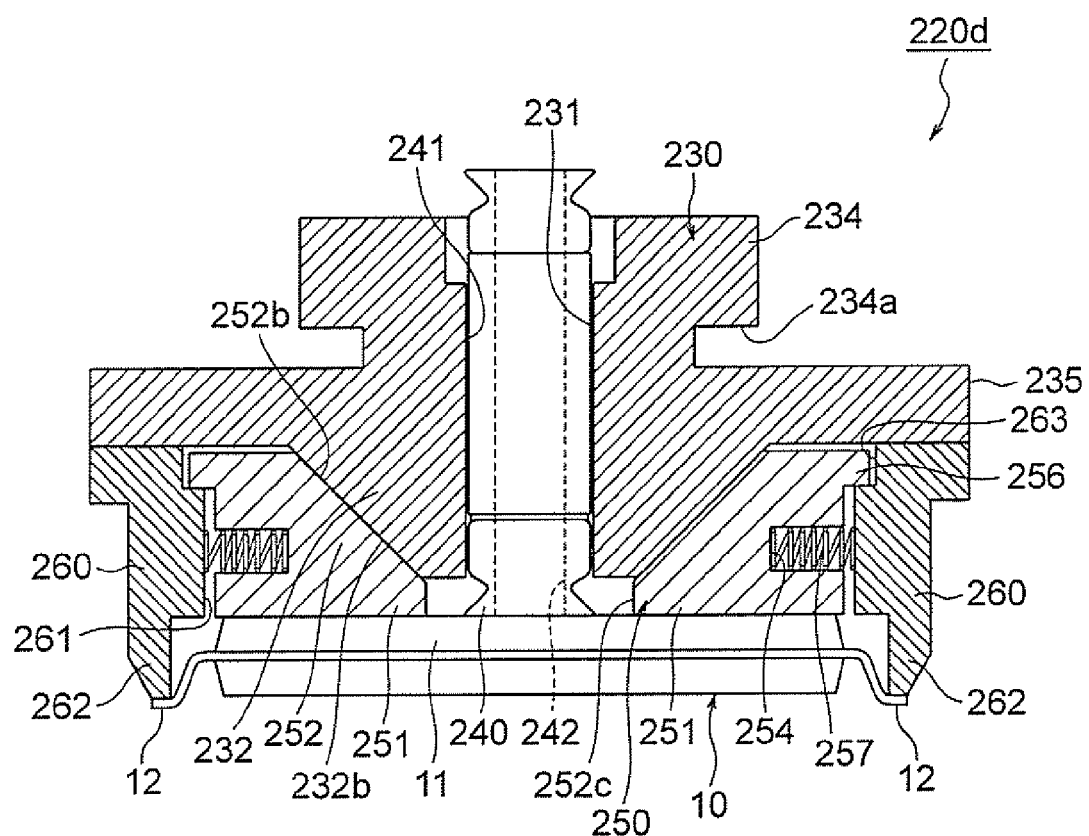
FIG. 10 is a cross-sectional view showing a contact pusher according to a fourth embodiment of the present invention.

In the contact pusher 220*d* according to a fourth embodiment of the present invention, as shown in the FIG. 10, instead of the second springs 237, the outer circumferential surface 232*b* of the bottom projecting part 232 of the base part 230 is inclined and the inner circumferential surface 252*b* of the center recessed part 252 of the first press part 250 is inclined so as to match with this inclination of this outer circumferential surface 232*b*.

In the present embodiment, when the first springs 257 cause the first press part 251 to be pushed to the center, the inner circumferential surface 252*b* of the first press part 250 is guided along the outer circumferential surface 232*b* of the base part 230 and the elastic force is converted from the horizontal direction to the vertical direction, so the IC device 10 is pushed against by a suitable load and the first press part 250 is constantly kept in close contact with the top surface of the package 11 of the IC device 10. Due to this, the base part 230 and the first press part 250 can be kept in a state enabling heat conduction and the first press part 250 can be finely moved in the vertical direction.

Fifth Embodiment

Figure 11:
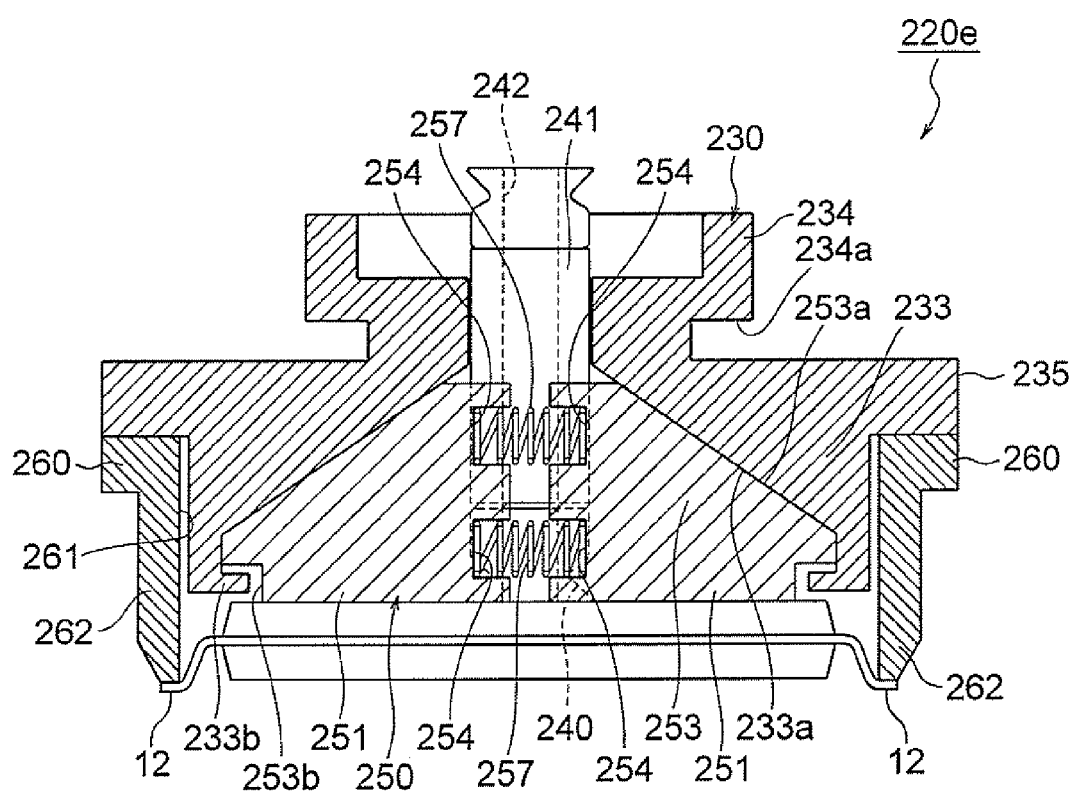
FIG. 11 is a cross-sectional view showing a contact pusher according to a fifth embodiment of the present invention.

The contact pusher 220*e* according to a fifth embodiment of the present invention, as shown in FIG. 11, has shapes of the bottom recessed part 232 of the base part 230 and the center projecting part 252 of the first press part 250 reversed from the case of the fourth embodiment.

In the present embodiment, the base part 230 has a bottom recessed part 233 projecting vertically downward at its bottom and an extending part 233*b* projecting inward formed at the opening edge of that recessed part 233. On the other hand, the first press part 250 has a center projecting part 253 corresponding to the bottom recessed part 233 of the base part 230 and is formed with a groove 253*b* at the bottom edge of that projecting part 253. Further, the extending part 233*b* of the base part 230 engages with the groove 253*b* of the first press part 250, whereby movement of the first press part 250 in the downward direction is limited. Due to this, the first press part 250 can be prevented from falling off and the first press part 250 can move with play within a predetermined fine amount of movement along with vertical direction.

In the present embodiment, the first press part 250 is divided into two pushing portions 251 along the axial center of the contact pusher 220*e* across that axial center. First springs 257 are interposed between these pushing portions 251.

When the first springs 257 push the pushing portions 251 to the outside, the first press parts 250 are guided at their outer circumferential surfaces 253a along the inner circumferential surface 233a of the base part 230. Due to this, the IC device 10 is pushed by a suitable load, and the first press part 250 constantly closely contacts the top surface of the package 11 of the IC device 10, so a state enabling conduction of heat between the base part 230 and first press part 250 can be maintained.

Sixth Embodiment

Figure 12:
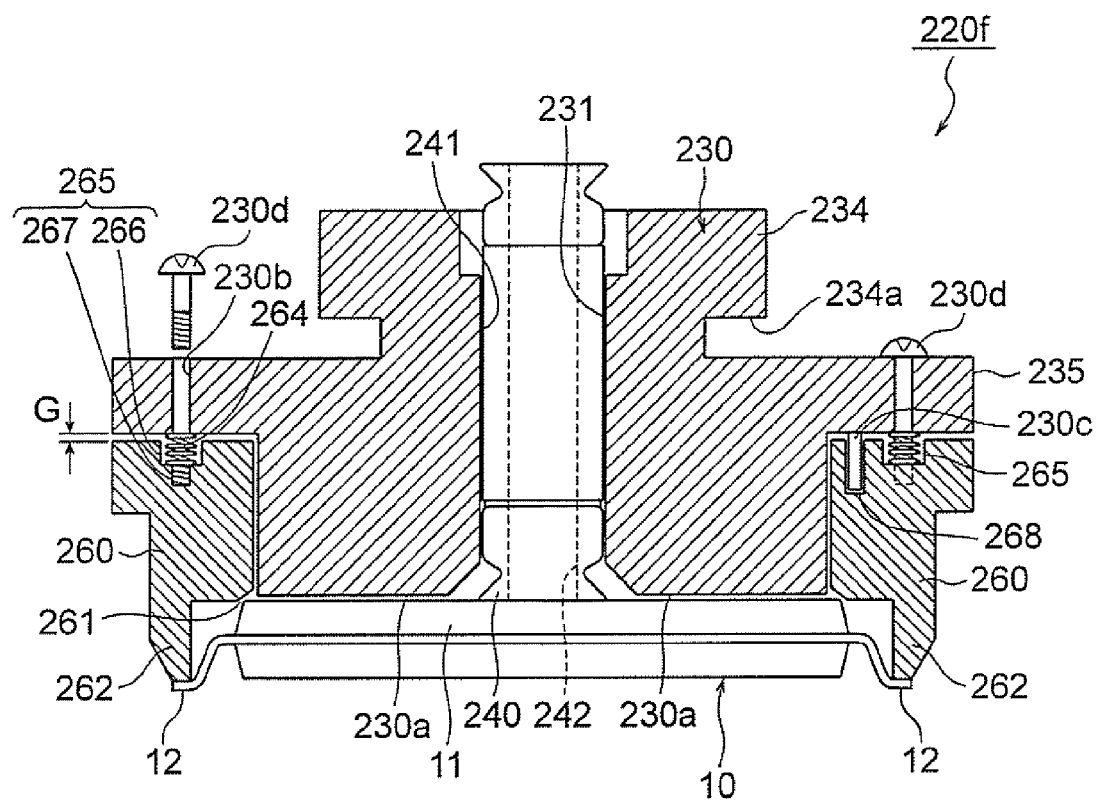
FIG. 12 is a cross-sectional view showing a contact pusher according to a sixth embodiment of the present invention.
Figure 13:
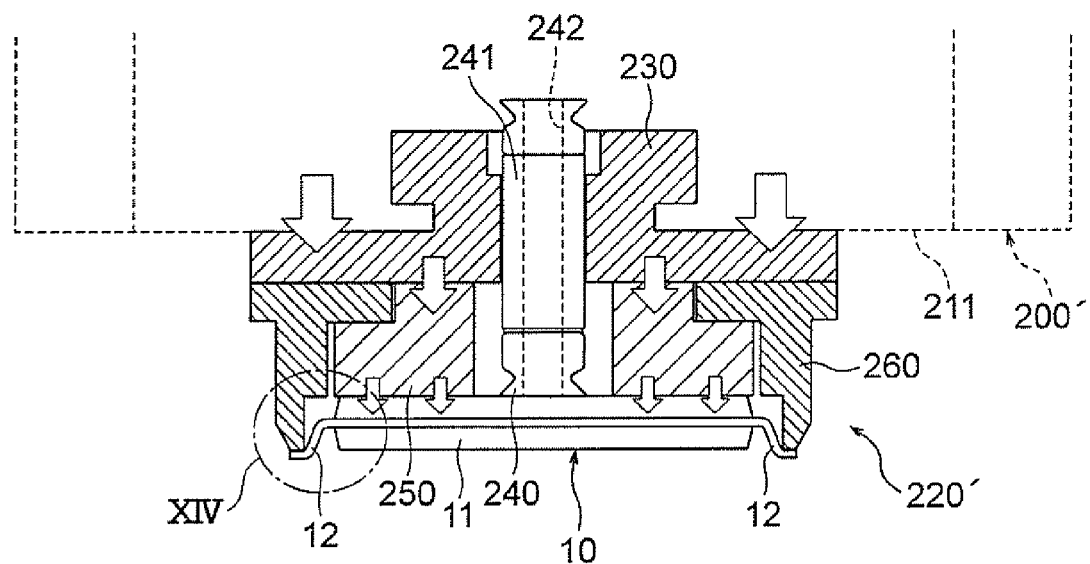
FIG. 13 is a cross-sectional view showing the structure of a conventional contact pusher.
Figure 14A:
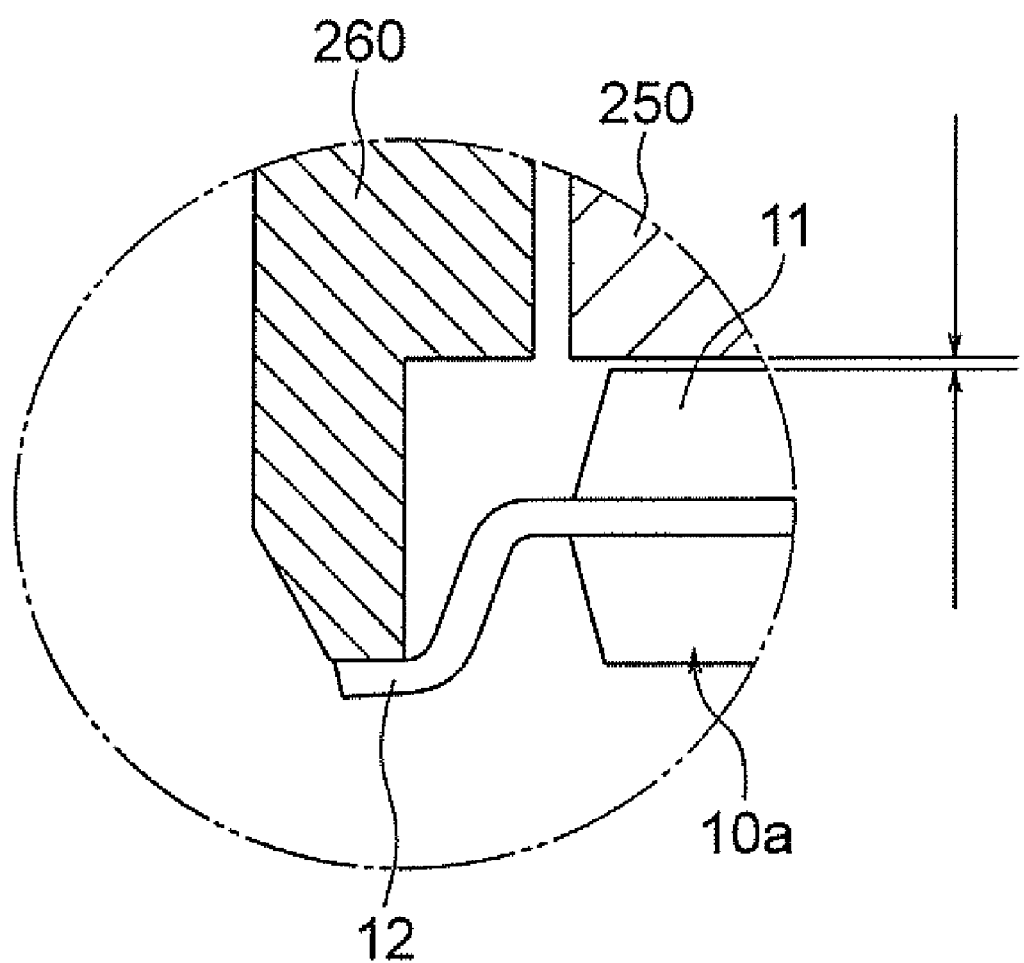
FIG. 14A is an enlarged sectional view of a part XIV of FIG. 13 and shows the state of pushing an IC device with a low height from the front ends of the terminals to the top surface of a package.
Figure 14B:
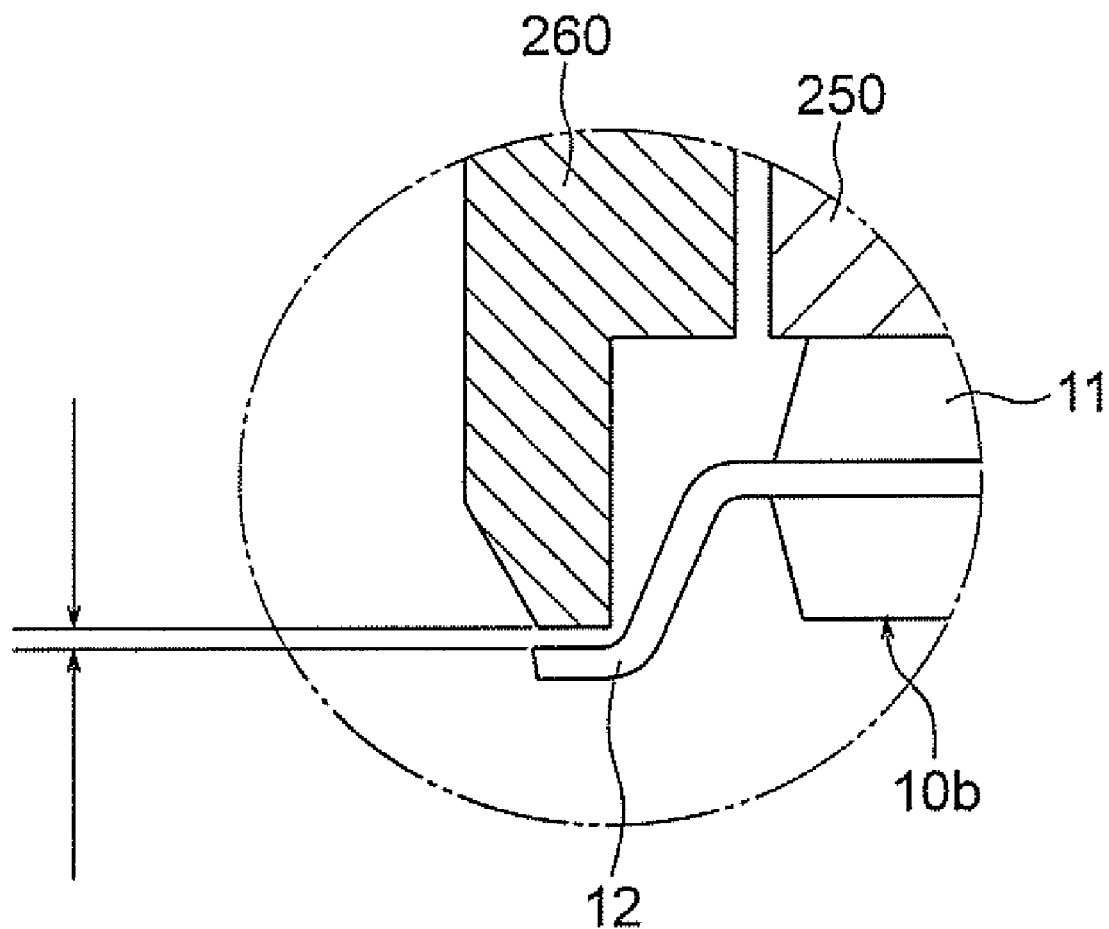
FIG. 14B is an enlarged sectional view of a part XIV of FIG. 13 and shows the state of pushing an IC device with a high height from the front ends of the terminals to the top surface of a package.

The contact pusher 220f according to a sixth embodiment of the present invention, as shown in FIG. 12, enables fine movement of the second press part 260 along the pushing direction and has the first press 250 formed integrally with the base part 230 in structure.

The base part 230 has an upper projecting part 234 and base body 235 in the same way as the first embodiment, but is formed with a projecting part 230a integral with the first press part 250 at the bottom part of the base body 235.

The top surface of the second press part 260 is formed with step-shaped columnar holes 265 each comprised of a large diameter part 266 positioned at the top and a small diameter part 267 below the large diameter part 266 and positioned concentrically with the large diameter part 266. The large diameter part 266 has an inside diameter able to accommodate a third spring 264. Further, the small diameter part 267 is formed with a female thread with which a screw 230d can engage. The peripheral holes 265 are arranged on the top surface of the second press part 260 at substantially equal intervals at three to four locations along the circumferential direction. Further, the top surface of the second press part 260 is formed with a guide hole 268 with which a guide pin 230c projecting from the base part 230 can fit.

The base body 235 of the base part 230 is formed with through holes 230b for passing screws 230d at positions corresponding to the columnar holes 265 of the second press part 260. Further, the bottom surface of the base body 235 is formed with a guide pin 230c projecting downward at a position corresponding to the guide hole 268 of the second press part 260.

In the present embodiment, third springs 264 are inserted into the columnar holes 265 and, in the state with clearance G formed between the base part 230 and second press part 260, the second press part 260 is screwed to the base part 230. Further, the guide pin 230c is inserted into the guide hole 268. Due to this guide structure, the second press part 260 is guided along the vertical direction. Therefore, the second press part 260 can move finely along the vertical direction (pushing direction).

Note that the above explained embodiments were described for facilitating understanding of the present invention and were not described for limiting the present invention. Therefore, the elements disclosed in the above embodiments include all design changes and equivalents falling under the technical scope of the present invention.

In the above embodiments, the first press part 250 was divided into two pushing portions 251, but the present invention is not particularly limited to this. It is also possible to divide the first press part into three or more pushing portions.

Further, in the above embodiments, the explanation was given of the case of use of the first springs 257 and second springs 237, but it is also possible to use elastic rubber, an elastic resin, or an elastic sheet material having the desired elastic characteristics or use the repulsion force or attraction force of magnets etc. instead of the elastic force.

Further, in the above embodiments, the explanation was given of testing QFP type IC devices with terminals 12 sticking out from the four sides, but the present invention is not particularly limited to this. For example, it may also be applied to an SOP (Small Outline Package) or other IC device abutting against the contact pins 320 at suitable positions and preventing deformation of the terminals 12.

Further, in the above embodiments, the explanation was given of an example not providing a positioning structure between each contact arm 210 and contact part 310, but the present invention is not particularly limited to this. A positioning structure may also be provided between the two. For example, the based part 230 of the contact arm 210 may be provided with two guide pins and the contact part 310 may be formed with two guide holes. At the time of contact, the guide pins may be engaged with the guide holes to enable the terminals 12 of the IC devices picked up at the base part 230 to be accurately brought into contact with the contact pins 320 of the contact part 310.

The invention claimed is:

1. A contact pusher configured to be attached to a front end of a contact arm, the contact pusher being configured to bring an electronic device under test into contact with a contact part of a test head by pushing against the electronic device under test, the contact pusher comprising:
   a holder configured to hold the electronic device under test;
   an elastic member;
   a first contactor configured to contact a body of the electronic device under test; and
   a thermal conductor configured to conduct heat to the first contactor, wherein
   the first contactor and the thermal conductor contact each other so as to conduct heat, the first contactor is configured to move in a direction to push against the electronic device under test,
   the first contactor is segmented to provide a plurality of contact portions, each of the contact portions contacting a surface of the body of the electronic device under test simultaneously, and
   the elastic member is configured to bias the contact portions in a direction substantially parallel to the surface of the electronic device under test.

2. A contact pusher configured to be attached to a front end of a contact arm, the contact pusher being configured to bring an electronic device under test into contact with a contact part of a test head by pushing against the electronic device under test, the contact pusher comprising:
   a holder configured to hold the electronic device under test;
   an attracting member;
   a first contactor configured to contact a body of the electronic device under test; and
   a thermal conductor configured to conduct heat to the first contactor, wherein:
   the first contactor and the thermal conductor contact each other so as to conduct heat, the first contactor is configured to move in a direction to push against the electronic device under test,
   the first contactor is segmented to provide a plurality of contact portions, each of the contact portions contacting a surface of the body of the electronic device under test simultaneously, and
   the attracting member is configured to attract the contact portions in a direction generally parallel to the surface of the electronic device under test.

3. The contact pusher as set forth in claim 1, wherein
   a first contactor has a recessed shape,
   the thermal conductor has a projecting shape corresponding to the recessed shape of the first contactor, and
   an inner circumferential surface of the recessed shape of the first contactor and the projecting outer circumferential surface of the projecting shape of the thermal conductor contact each other so as to conduct heat.

4. The contact pusher as set forth in claim 3, further comprising a second elastic member configured to bias the contacts portions in a direction substantially perpendicular to a main surface of the electronic device under test.

5. The contact pusher as set forth in claim 3, wherein
the inner circumferential surface of the recessed shape of the first contactor is inclined, and
the projecting outer circumferential surface of the thermal conductor is inclined corresponding to the inner circumferential surface of the recessed shape of the first contactor.

6. The contact pusher as set forth in claim 1, wherein
the first contactor has a projecting shape,
the thermal conductor has a recessed shape corresponding to the projecting shape of the first contactor, and
a projecting outer circumferential surfaces of the projecting shape of the first contactor and an inner circumferential surface of the recessed shape of the thermal conductor contact each other so as to conduct heat.

7. The contact pusher as set forth in claim 6, further comprising a second elastic member configured to bias the contact portions in a direction substantially perpendicular to a main surface of the electronic device under test.

8. The contact pusher as set forth in claim 6, wherein
the projecting outer circumferential surface of the first contactor is inclined, and
the inner circumferential surface of the thermal conductor is inclined so as to correspond to the projecting outer circumferential surface of the first contactor.

* * * * *